US007286013B2

(12) United States Patent
Vice

(10) Patent No.: US 7,286,013 B2
(45) Date of Patent: Oct. 23, 2007

(54) COUPLED-INDUCTANCE DIFFERENTIAL AMPLIFIER

(75) Inventor: Michael W. Vice, El Granada, CA (US)

(73) Assignee: Avago Technologies Wireless IP (Singapore) Pte Ltd, Singapore (SG)

( * ) Notice: Subject to any disclaimer, the term of this patent is extended or adjusted under 35 U.S.C. 154(b) by 79 days.

(21) Appl. No.: 10/667,019

(22) Filed: Sep. 18, 2003

(65) Prior Publication Data
US 2005/0062533 A1 Mar. 24, 2005

(51) Int. Cl.
*H03F 3/45* (2006.01)
(52) U.S. Cl. .................. 330/253; 330/252
(58) Field of Classification Search ........... 330/252, 330/253, 261, 258; 327/359
See application file for complete search history.

(56) References Cited

U.S. PATENT DOCUMENTS

| 4,473,804 | A |   | 9/1984 | Wahkquist |        |
|-----------|---|---|--------|-----------|--------|
| 5,343,162 | A | * | 8/1994 | Davis     | 330/252|
| 6,023,192 | A | * | 2/2000 | Didier    | 330/254|
| 6,342,813 | B1| * | 1/2002 | Imbornone et al. | 330/252 |
| 6,366,166 | B1| * | 4/2002 | Belot     | 330/252|
| 6,639,468 | B2| * | 10/2003| Belot     | 330/252|
| 7,098,737 | B2| * | 8/2006 | Fujimoto et al. | 330/283 |
| 2002/0180534 | A1 |   | 12/2002 | Florian et al. | |
| 2005/0162229 | A1 | * | 7/2005 | Notthoff  | 330/252|

FOREIGN PATENT DOCUMENTS

WO WO02/093735 A1 11/2002

OTHER PUBLICATIONS

Cassan et al., A 1-V Transformer-Feedback Low-Noise Amplifier for 5-GHz Wireless LAN in 0.18-um CMOS, (IEEE Journal of Solid-State Circuits, vol. 38, No. 3, Mar. 2003), p. 432.*
Zhou et al., Monolithic Transformer and Their Application in a Differential CMOS RD Low-Noise Amplifier, (IEEE Journal of Solid-State Circuits, vol. 33, No. 12, Dec. 1998), p. 2024.*

* cited by examiner

*Primary Examiner*—Khanh Van Nguyen

(57) ABSTRACT

A differential amplifier that employs mutually coupled inductors to provide desired levels of inductance in a substantially smaller form factor in comparison to individual inductor components. Mutually coupled inductors according to the present teachings may also be used to increase common mode rejection in a differential amplifier.

20 Claims, 2 Drawing Sheets

COUPLED-INDUCTANCE DIFFERENTIAL AMPLIFIER

BACKGROUND

Differential amplifiers may be employed in a variety of electronic circuits including circuits that operate at radio frequency (RF), microwave, and millimeter wave frequencies. A differential amplifier may include a pair of transistors that generate a differential output signal at a pair of output ports in response to a differential input signal received at a pair of input ports.

A prior differential amplifier may include a set of individual inductor components. For example, inductor components may be used for transistor biasing in a differential amplifier. In addition, inductor components may be used for impedance matching at the input and/or output ports of a differential amplifier. Inductor components may also be used for noise reduction in a differential amplifier.

Unfortunately, the physical space taken up by the winding structures of individual inductor components may hinder attempts to decrease the physical size of a differential amplifier. The size limitations imposed by the physical dimensions of inductor components may be a particular hindrance in the design of differential amplifiers contained on integrated circuit chips. In addition, electrical interactions that may occur between individual inductor components may alter the frequency response of a differential amplifier away from its desired response.

SUMMARY OF THE INVENTION

A differential amplifier is disclosed that employs mutually coupled inductors to provide desired levels of inductance in a substantially smaller form factor in comparison to individual inductor components. Mutually coupled inductors according to the present teachings may also be used to increase common mode rejection in a differential amplifier.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
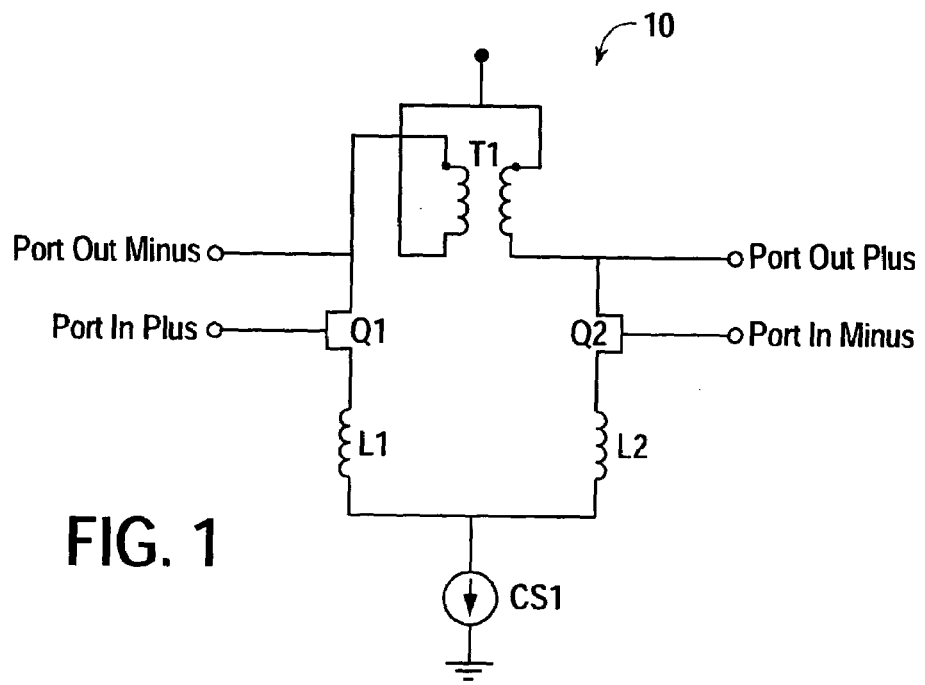
FIG. 1 shows a differential amplifier according to the present teachings.

FIG. 1 shows a differential amplifier 10 according to the present teachings. The differential amplifier 10 includes a pair of transistors Q1 and Q2. The transistors Q1 and Q2 may be field-effect transistors (FETs) or alternatively bipolar junction transistors (BJTs). The differential amplifier 10 generates a differential output signal at its output ports (PORT OUT PLUS and PORT OUT MINUS) in response to a differential input signal received at its input ports (PORT IN PLUS and PORT IN MINUS).

The differential amplifier 10 includes a pair of mutually coupled inductors in the form of a transformer T1. The mutually coupled inductors in the transformer T1 in the embodiment shown are used for biasing the transistors Q1 and Q2 and for providing impedance matching at the output ports PORT OUT PLUS and PORT OUT MINUS of the differential amplifier 10.

The transformer T1 is wired so that the effective inductances of its individual inductor windings are augmented by mutual coupling when the differential amplifier 10 is excited in the differential mode. This augmentation of inductance substantially reduces the physical size of the windings structure of the transformer T1 in comparison to the physical size of the winding structures of separate inductor components as in the prior art that achieve the same values of inductance. Thus, the transformer T1 is substantially smaller than individual inductor components having equivalent inductance both in terms of circuit footprint and the number of the turns. The circuit space/size savings provided by the transformer Ti enables an overall reduction in the physical size of the differential amplifier 10.

In the common mode, the transformer T1 is excited in common mode from the drains of the transistors Q1 and Q2 so that the effective inductances of the windings of the transformer T1 are reduced by the effect of mutual coupling. This reduction in inductance in the common mode works to short out the common mode output of the differential amplifier 10 and improves the common mode rejection of the differential amplifier 10.

The differential amplifier 10 in the embodiment shown includes a pair individual inductor components L1 and L2 that may be used to provide input port matching for the differential amplifier 10. In other embodiments, the inductor components L1 and L2 may be omitted from the circuit.

Figure 2:
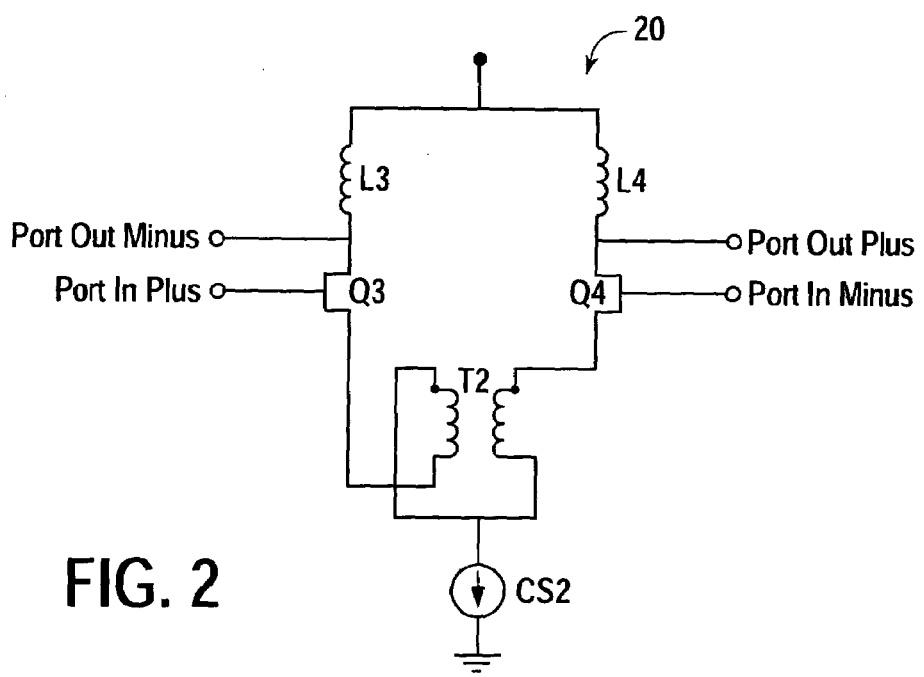
FIG. 2 shows another differential amplifier according to the present teachings.

FIG. 2 shows a differential amplifier 20 according to the present teachings. The differential amplifier 20 includes a pair of transistors Q3 and Q4 that may be field-effect transistors (FETs) or alternatively bipolar junction transistors (BJTs). The differential amplifier 20 includes a pair of mutually coupled inductors in the form of a transformer T2 for providing impedance matching at the input ports (PORT IN PLUS and PORT IN MINUS) of the differential amplifier 20 and for controlling noise in the differential amplifier 20.

The transformer T2 is wired so that the effective inductances of its individual inductor windings are augmented by the mutual coupling when the differential amplifier 20 is excited in the differential mode. Thus, the overall size of the transformer T2 can be made substantially smaller than if two separate inductor components were to be used to provide input impedance matching and noise control.

Figure 4:
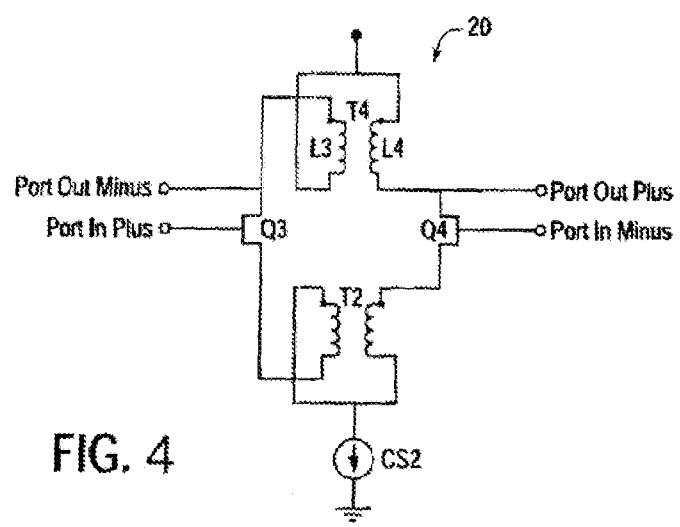
FIG. 4 shows yet another differential amplifier according to the present teachings.

The differential amplifier 20 in the embodiment shown includes a pair of individual inductor components L3 and L4 that may be used for transistor biasing and output port matching in the differential amplifier 20. The inductor components L3 and L4 may be omitted from the circuit. Alternatively as illustrated in FIG. 4, the inductor components L3 and L4 may be replaced with a transformer T4 like the transformer T1 in FIG. 1, to yield further circuit space savings and improved common mode rejection.

Figure 3:
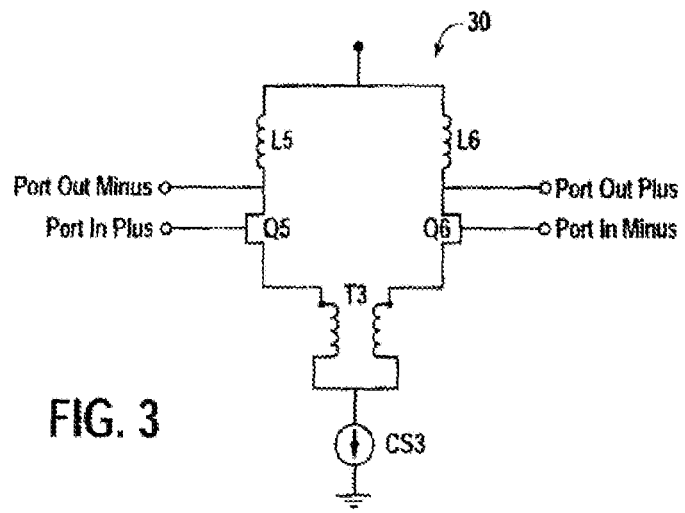
FIG. 3 shows yet another differential amplifier according to the present teachings.

FIG. 3 shows a differential amplifier 30 according to the present teachings that includes a pair of transistors Q5-Q6 and a pair of mutually coupled inductors in the form of a transformer T3 for providing input impedance matching and for noise. The transformer T3 is wired so that the effective inductances of its individual inductor windings are augmented by the mutual coupling when the differential amplifier 30 is excited in the common mode. Thus, the transformer T3 improves the common mode rejection of the differential amplifier 30. mode rejection of the differential amplifier 30.

Figure 5:
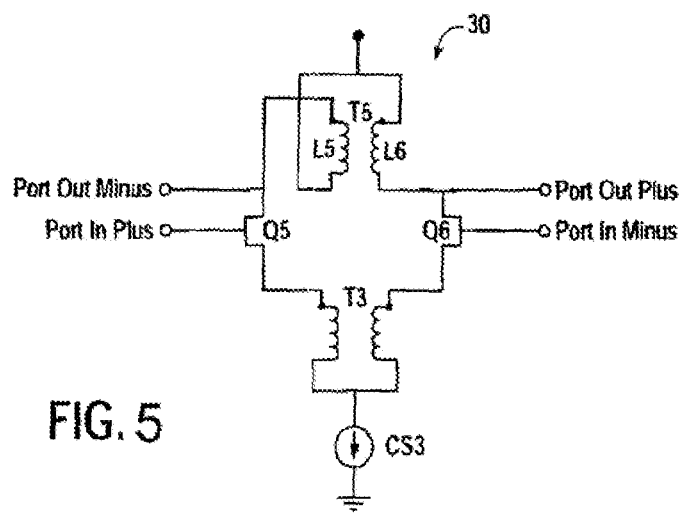
FIG. 5 shows yet another differential amplifier according to the present teachings.

The differential amplifier 30 in the embodiment shown includes a pair of individual inductor components L5 and L6 that may be used for transistor biasing and output port matching for the differential amplifier 30 or that may be omitted from the circuit. Alternatively as illustrated in FIG. 5, the inductor components L5 and L6 may be replaced with a transformer T5, like the transformer T1 in FIG. 1, to yield circuit space savings and additional common mode rejection.

The present techniques enable a reduction in the physical size of a differential amplifier while also improving the common mode rejection of the differential amplifier. The present techniques also improve the layout robustness of a differential amplifier circuit in terms of unwanted parasitic couplings.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A differential amplifier, comprising:
   a pair of transistors;
   a pair of inductors that provide impedance matching for the differential amplifier and that are arranged such that the inductors have a mutual inductance that increases when the differential amplifier is in a common mode.

2. The differential amplifier of claim 1, wherein the inductors comprise a transformer.

3. The differential amplifier of claim 1, wherein the inductors are arranged to provide input impedance matching for the differential amplifier.

4. The differential amplifier of claim 1, wherein the inductors are coupled to a source terminal of each transistor.

5. The differential amplifier of claim 1, wherein the inductors are arranged to provide noise control for the differential amplifier.

6. The differential amplifier of claim 1, wherein the inductors are arranged to increase common mode rejection in the differential amplifier.

7. The differential amplifier of claim 1, further comprising a second pair of inductors that are arranged to bias the transistors.

8. The differential amplifier of claim 7, wherein the second pair of inductors are arranged to have a mutual inductance that increases when the differential amplifier is excited in the differential mode.

9. The differential amplifier of claim 8, wherein the second pair of inductors comprise a transformer.

10. The differential amplifier of claim 9, wherein the second pair of inductors are arranged to provide output impedance matching.

11. A method for providing a differential amplifier, comprising providing a pair of transistors; and arranging a pair of inductors for impedance matching to the differential amplifier such that the inductors have a mutual inductance that increases when the differential amplifier is in a common mode.

12. The method of claim 11, wherein arranging comprises arranging the inductors for form a transformer.

13. The method of claim 11, wherein arranging comprises arranging the inductors to provide input impedance matching for the differential amplifier.

14. The method of claim 11, wherein arranging comprises coupling the inductors to a source terminal of each transistor.

15. The method of claim 11, wherein arranging comprises coupling the inductors to provide noise control for the differential amplifier.

16. The method of claim 11, wherein arranging comprises coupling the inductors to increase common mode rejection in the differential amplifier.

17. The method of claim 11, further comprising arranging a second pair of inductors that bias the transistors.

18. The method of claim 17, wherein arranging a second pair of inductors comprises arranging the second pair of inductors to have a mutual inductance that increases when the differential amplifier is excited in the differential mode.

19. The method of claim 18, wherein arranging a second pair of inductors comprises arranging the second pair of inductors to form a transformer.

20. The method of claim 19, wherein arranging a second pair of inductors comprises arranging the second pair of inductors to provide output impedance matching for the differential amplifier.

* * * * *